United States Patent
Sawyer et al.

(10) Patent No.: US 6,862,180 B2
(45) Date of Patent: Mar. 1, 2005

(54) HOUSINGS FOR CIRCUIT CARDS

(75) Inventors: Michael Sawyer, Madison, TN (US); Matthew J. Kusz, Minneapolis, MN (US); Gary Gustine, Bonham, TX (US); Charles G. Ham, Mound, MN (US); Fredrick A. Daniels, Floral City, FL (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/155,050

(22) Filed: May 24, 2002

(65) Prior Publication Data

US 2003/0218867 A1 Nov. 27, 2003

(51) Int. Cl.⁷ ................................................. H05K 7/20
(52) U.S. Cl. ........................ 361/690; 361/719; 361/721; 455/128
(58) Field of Search ................................. 361/690, 692, 361/704, 716, 721; 174/52.1; 454/184

(56) References Cited

U.S. PATENT DOCUMENTS

| | | |
|---|---|---|
| 2,737,579 A | 3/1956 | Wehrlin et al. |
| 2,796,559 A | 6/1957 | Fleucht |
| 2,833,966 A | 5/1958 | Goodier et al. |
| 2,876,277 A | 3/1959 | Badger et al. |
| 3,087,095 A | 4/1963 | McConkey, Jr. et al. |
| 3,135,321 A | 6/1964 | Butt et al. |
| 3,366,171 A | 1/1968 | Scharli |
| 3,467,891 A | 9/1969 | Mogle |
| 3,487,267 A | 12/1969 | Winston et al. |
| 3,697,929 A | 10/1972 | Konewko et al. |
| 3,767,974 A | 10/1973 | Donovan, Jr. et al. |

(List continued on next page.)

FOREIGN PATENT DOCUMENTS

| | | |
|---|---|---|
| EP | 1 041 002 | 10/2000 |
| GB | 2 193 552 | 2/1988 |
| JP | 58-634 | 6/1981 |
| JP | 58-105187 | 7/1983 |
| JP | 60 79834 | 5/1985 |
| JP | 60-26936 | 2/1987 |
| JP | 62-67936 | 3/1987 |
| JP | 62-79404 | 4/1987 |
| JP | 2-4287 | 1/1990 |
| JP | 2-166798 | 6/1990 |
| JP | 7-177645 | 7/1995 |
| JP | 8-65868 | 3/1996 |

OTHER PUBLICATIONS

Abacon Telecommunications, HDSL Low Capacity Repeater Case, 1 pg., date unknown.
Abacon Telecommunications, HDSL High Capacity Repeater Case, 2 pgs., date unknown.
Circa Enterprises, Inc. "Digital Repeater Housings—HDSL Repeater", 2 pgs., 2000.
Circa Enterprises, Inc. "Digital Repeater Housings—T1 Repeater", 2 pgs., 2000.

(List continued on next page.)

Primary Examiner—Boris Chervinsky
(74) Attorney, Agent, or Firm—Fogg and Associates, LLC; Laura A. Ryan

(57) ABSTRACT

A housing for circuit cards is provided. The housing has a shell. A thermally conductive liner integral with the shell lines an interior of the shell. A protrusion of the liner extends through the shell and contacts the shell to form a pressure seal between the liner and the shell. A heat sink is disposed on an exterior surface of the shell and is thermally coupled to the protrusion of the liner. A case is disposed within the liner and is thermally coupled to the liner. The case is adapted to receive a plurality of circuit cards so that the plurality of circuit cards is thermally coupled to the case.

31 Claims, 7 Drawing Sheets

U.S. PATENT DOCUMENTS

| | | |
|---|---|---|
| 3,809,798 A | 5/1974 | Simon |
| 3,997,819 A | 12/1976 | Eggert et al. |
| 4,172,212 A | 10/1979 | Heinzer |
| 4,184,539 A | 1/1980 | Rein |
| 4,259,843 A | 4/1981 | Kausch |
| 4,301,494 A | 11/1981 | Jordan |
| 4,449,576 A | 5/1984 | Baum et al. |
| 4,528,615 A | 7/1985 | Perry |
| 4,547,833 A | 10/1985 | Sharp |
| 4,559,790 A | 12/1985 | Houston |
| 4,564,061 A | 1/1986 | Rauth et al. |
| 4,656,559 A | 4/1987 | Fathi |
| 4,662,002 A | 4/1987 | Davis et al. |
| 4,679,250 A | 7/1987 | Davis et al. |
| 4,777,561 A | 10/1988 | Murphy et al. |
| 4,805,482 A | 2/1989 | Boda |
| 4,815,913 A | 3/1989 | Hata et al. |
| 4,849,858 A | 7/1989 | Grapes et al. |
| 4,858,068 A | 8/1989 | Bitller et al. |
| 4,858,070 A | 8/1989 | Buron et al. |
| 4,953,058 A | 8/1990 | Harris |
| 4,962,444 A | 10/1990 | Niggemann |
| 4,962,445 A | 10/1990 | Pelet et al. |
| 4,987,978 A | 1/1991 | Jungersen |
| 5,019,939 A | 5/1991 | Reimer |
| 5,045,971 A | 9/1991 | Ono et al. |
| 5,048,793 A | 9/1991 | Mefford et al. |
| 5,089,935 A | 2/1992 | Ito |
| 5,105,337 A | 4/1992 | Bitller et al. |
| 5,267,122 A | 11/1993 | Glover et al. |
| 5,309,315 A | 5/1994 | Naedel et al. |
| 5,329,425 A | 7/1994 | Leyssens et al. |
| 5,424,916 A | 6/1995 | Martin |
| 5,432,682 A | 7/1995 | Giehl et al. |
| 5,519,573 A | 5/1996 | Cobb et al. |
| 5,642,264 A | 6/1997 | Cantrell |
| 5,825,621 A * | 10/1998 | Giannatto et al. .......... 361/701 |
| 5,842,514 A | 12/1998 | Zapach et al. |
| 5,896,268 A | 4/1999 | Beavers |
| 5,946,193 A * | 8/1999 | Hendrix et al. ............. 361/704 |
| 5,995,378 A | 11/1999 | Farnworth et al. |
| 6,002,588 A | 12/1999 | Vos et al. |
| 6,038,129 A | 3/2000 | Falaki et al. |
| 6,045,140 A | 4/2000 | Morris, Jr. |
| 6,104,611 A | 8/2000 | Glover et al. |
| 6,118,662 A * | 9/2000 | Hutchison et al. .......... 361/704 |
| 6,209,631 B1 | 4/2001 | Garcia-Ortiz |
| 6,289,678 B1 | 9/2001 | Pandolfi |
| 6,292,556 B1 | 9/2001 | Laetsch |
| 6,295,208 B1 | 9/2001 | Murchison et al. |
| 6,310,772 B1 | 10/2001 | Hutchison et al. |
| 6,381,146 B1 | 4/2002 | Sevier |
| 6,396,691 B1 * | 5/2002 | Pagnozzi .................... 361/690 |
| 6,404,637 B2 | 6/2002 | Hutchison et al. |
| 6,406,312 B1 | 6/2002 | Heitkamp |
| 6,430,044 B2 * | 8/2002 | Hutchinson et al. ........ 361/690 |
| 6,493,236 B1 | 12/2002 | Momiyama et al. |
| 6,510,223 B2 | 1/2003 | Laetsch |
| 6,535,603 B2 | 3/2003 | Laetsch |
| 6,587,339 B1 * | 7/2003 | Daniels et al. .............. 361/690 |
| 6,611,426 B2 * | 8/2003 | Hutchison et al. .......... 361/690 |

OTHER PUBLICATIONS

"Hardened Telecom Enclosures for Optimal Thermal Management of Electronics", SPC TelEquip, pp. 1–20, date unknown.

Seri Lee, "How to Select a Heat Sink," Electronics Cooling, 9 pgs., Oct. 6, 2000.

Joe Ricke Sr., "Managing Heat in Electronic Enclosures," Electronic Packaging & Production, pp. 87–88, 90, 92, vol. 36, No. 2, Feb. 1996.

Gary Gustine et al., U.S. patent application No. 09/804,129, "Mechanical Housing", filed Mar. 12, 2001.

Gary Gustine et al., U.S. patent application No. 09/918,989, "Clamping Case", filed Jul. 31, 2001.

Gary Gustine et al., U.S. patent application No. 09/919,006, "Clamping Receptacle", filed Jul. 31, 2001.

Su, "Case for Mounting Slidably a Data Storage Medium in a Computer Housing" Patent Publication No. US 2002/0141153 A1, Filed Jul. 9, 2001, Published Oct. 3, 2002. (9 pgs.).

* cited by examiner

HOUSINGS FOR CIRCUIT CARDS

TECHNICAL FIELD

The present invention relates generally to the field of housings and, in particular, to housings for circuit cards.

BACKGROUND

Many housings, such as telecommunications housings, contain and environmentally protect electronic circuit cards, such as line cards, management cards, splitter cards, repeater cards, or the like. These housings often contain one or more cases to confine circuit cards to different locations within the housings. Typically, these cases are thermally conducting and are thermally coupled to the circuit cards and to the housing. The housing acts as a heat sink, and heat is transferred from the circuit cards to the case, from the case to the housing, and from the housing to the environment surrounding the housing. However, many housings, such as 819-type repeater housings, are fabricated from materials, such as plastics, that are poor heat conductors and thus are not effective as heat sinks. In some applications, heat sinks are secured to outer surfaces of the housing and extend though apertures in the housing to make thermal contact with the cases. However, a pressure differential is frequently imposed between the interior and exterior of the housing, and it is difficult to seal these apertures against the pressure differential.

For the reasons stated above, and for other reasons stated below that will become apparent to those skilled in the art upon reading and understanding the present specification, there is a need in the art for alternatives for sealing housings against pressure differentials.

SUMMARY

The above-mentioned problems with sealing housings against pressure differentials and other problems are addressed by embodiments of the present invention and will be understood by reading and studying the following specification.

In one embodiment, a housing for circuit cards is provided. The housing has a shell. A thermally conductive liner integral with the shell lines an interior of the shell. A protrusion of the liner extends through the shell and contacts the shell to form a pressure seal between the liner and the shell. A heat sink is disposed on an exterior surface of the shell and is thermally coupled to the protrusion of the liner. A case is disposed within the liner and is thermally coupled to the liner. The case is adapted to receive a plurality of circuit cards so that the plurality of circuit cards is thermally coupled to the case.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide a housing for circuit cards. The housing is interiorly lined with a thermally conductive liner that is integral with the housing. A protrusion of the liner extends through the housing and contacts the housing to form a pressure seal between the liner and the housing. A heat sink is disposed on an exterior of the housing and is thermally coupled to the protrusion of the liner. A case is disposed within the liner and is thermally coupled thereto. The case is adapted to receive a plurality of circuit cards so that the plurality of circuit cards is thermally coupled to the case. Therefore, the plurality of circuit cards is thermally coupled to the heat sink via the case and liner. The thermally conductive liner overcomes many of the sealing problems associated with heat sinks that extend through apertures within housings to thermally contact cases located within the housings for containing circuit cards.

Figure 1:
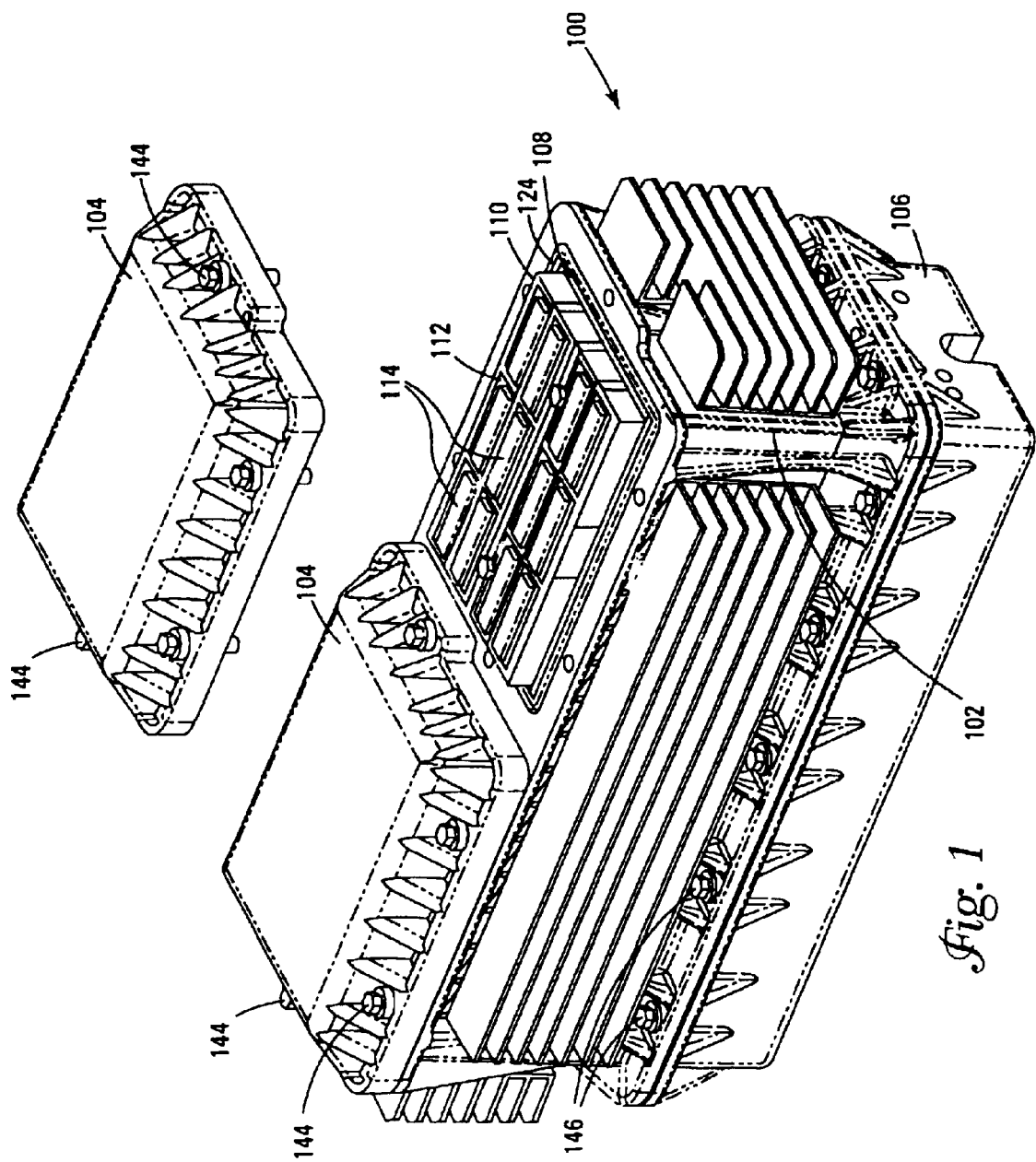
FIG. 1 is a top isometric view of an environmentally protected housing according to an embodiment of the present invention.

FIG. 1 is a top isometric view of an environmentally protected housing 100, such as an 819-type repeater housing, according to an embodiment of the present invention. Housing 100 includes shell 102 that is selectively sealed against the weather and/or a pressure differential by a pair of first covers 104 and a second cover 106 located opposite first covers 104. The term "weather" includes moisture, such as rain and/or humidity, salt fog, or the like. In one embodiment, shell 102 is divided into two compartments 108. Each of compartments 108 receives a case 110. Case 110 includes a number of slots 112 adapted to respectively receive a number of circuit cards 114, such as a repeater cards, line cards, or the like.

Figure 2:
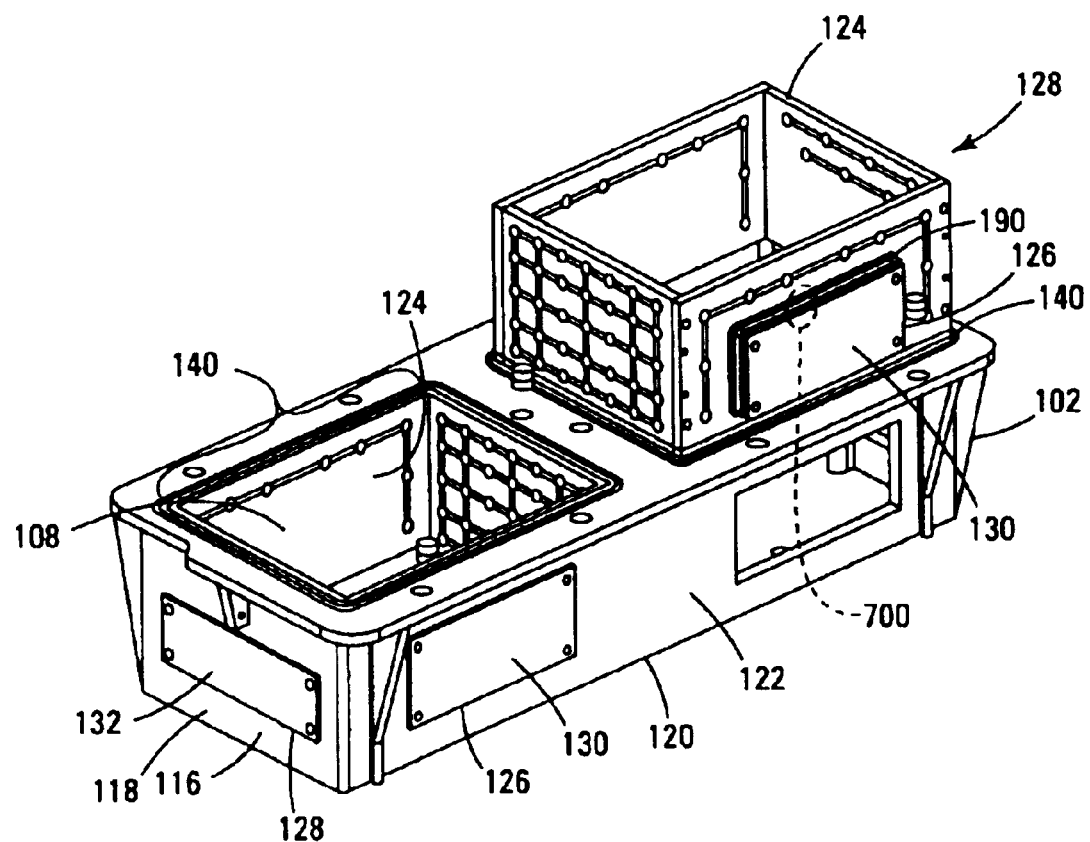
FIG. 2 is a top isometric view of a shell of the housing of FIG. 1.
Figure 3:
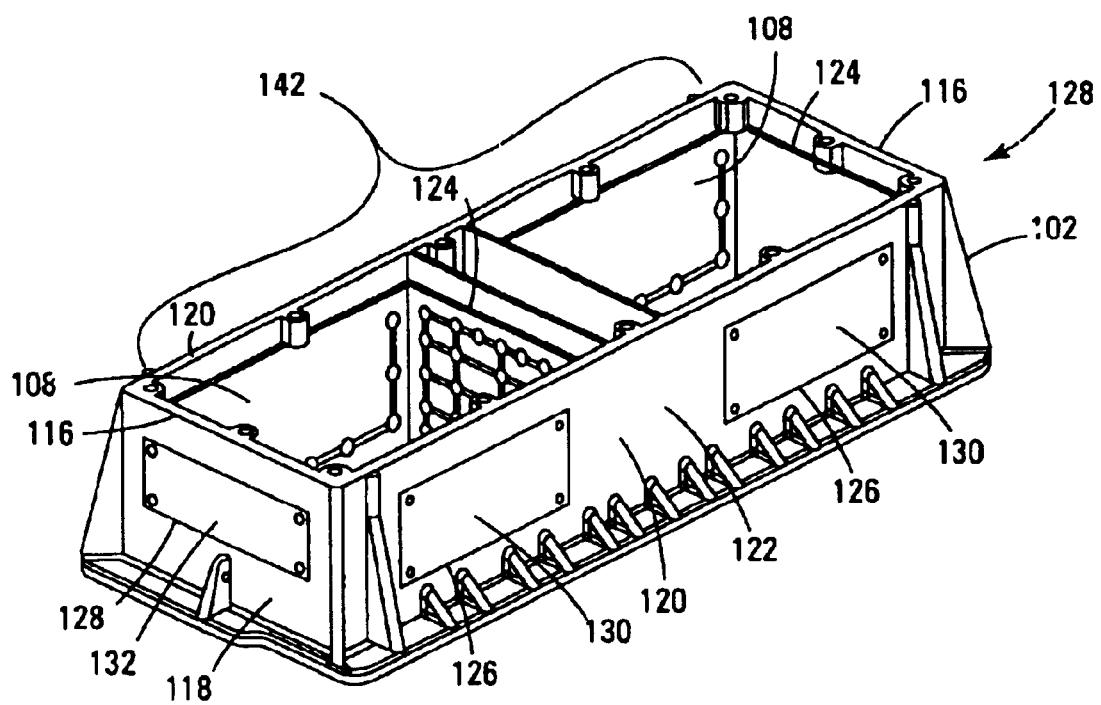
FIG. 3 is a bottom isometric view of the shell of FIG. 2.

FIGS. 2 and 3 are respectively top and bottom isometric views of shell 102. Shell 102 has opposing end walls 116 having exterior surfaces 118 and opposing side walls 120 having exterior surfaces 122. Liners 124 are respectively disposed within and line compartments 108, as shown in FIGS. 2 and 3. In one embodiment, liners 124 are integral with shell 102. In another embodiment, shell 102 is molded over liners 124 to form compartments 108. In other embodiments, liners 124 are bonded to shell 102. Liners 124 are of a thermally conductive material, such as aluminum or the like.

In one embodiment, each of liners 124 includes opposing side protrusions 126 and an end protrusion 128. Side protrusions 126 of each of liners 124 respectively extend through sidewalls 120 so that a surface 130 of each of side protrusions 126 is substantially flush with surface 122 of the respective sidewall 120. The end protrusion 128 of each of liners 124 extends through one of end walls 116 so that a surface 132 of end protrusion 128 is substantially flush with surface 118 of end wall 116. A perimeter 190 of each of side protrusions 126 and the end protrusion 128 of each of liners 124, as shown for one of side protrusions 126 in FIG. 2, makes contact with shell 102 to form a pressure seal between shell 102 and liner 124. In another embodiment, side protrusions 126 and end protrusion 128 are integral with liner 124. In some embodiments, side protrusions 126 and end protrusion 128 are attached to liner 124 by bolting, screwing, welding, brazing, or the like.

Cases 110 are respectively contained within liners 124, as shown in FIG. 1, and are respectively thermally coupled to liners 124. In one embodiment, case 110 is thermally coupled to liner 124 by direct contact, e.g., achieved by fastening case 110 against liner 116 using cap screws, frictionally engaging case 110 and liner 124, or the like. In various embodiments, each of circuit cards 114 is clamped within case 110 so that each of circuit cards 114 is thermally coupled to case 110 by direct contact, e.g., as described in U.S. patent application Ser. No. 09/919,006, entitled CLAMPING RECEPTACLE, filed on Jul. 31, 2001 and U.S. patent application Ser. No. 09/804,129, entitled MECHANICAL HOUSING, filed on Mar. 12, 2001, which applications are incorporated herein by reference.

Each of compartments 108 includes an aperture 140, as shown in FIG. 2, that is selectively sealed against the weather and/or a pressure differential by one of covers 104. Shell 102 has an aperture 142, shown in FIG. 3, opposite apertures 140 selectively sealed by cover 106 against the weather and/or a pressure differential. In one embodiment, shell 102, covers 104, and cover 106 are of glass-filled nylon or the like. Fasteners 144, e.g., cap screws or the like, secure covers 104 to shell 102, while fasteners 146, e.g., cap screws, bolts, or the like, secure cover 106 to shell 102, as shown in FIG. 1.

Figure 4:
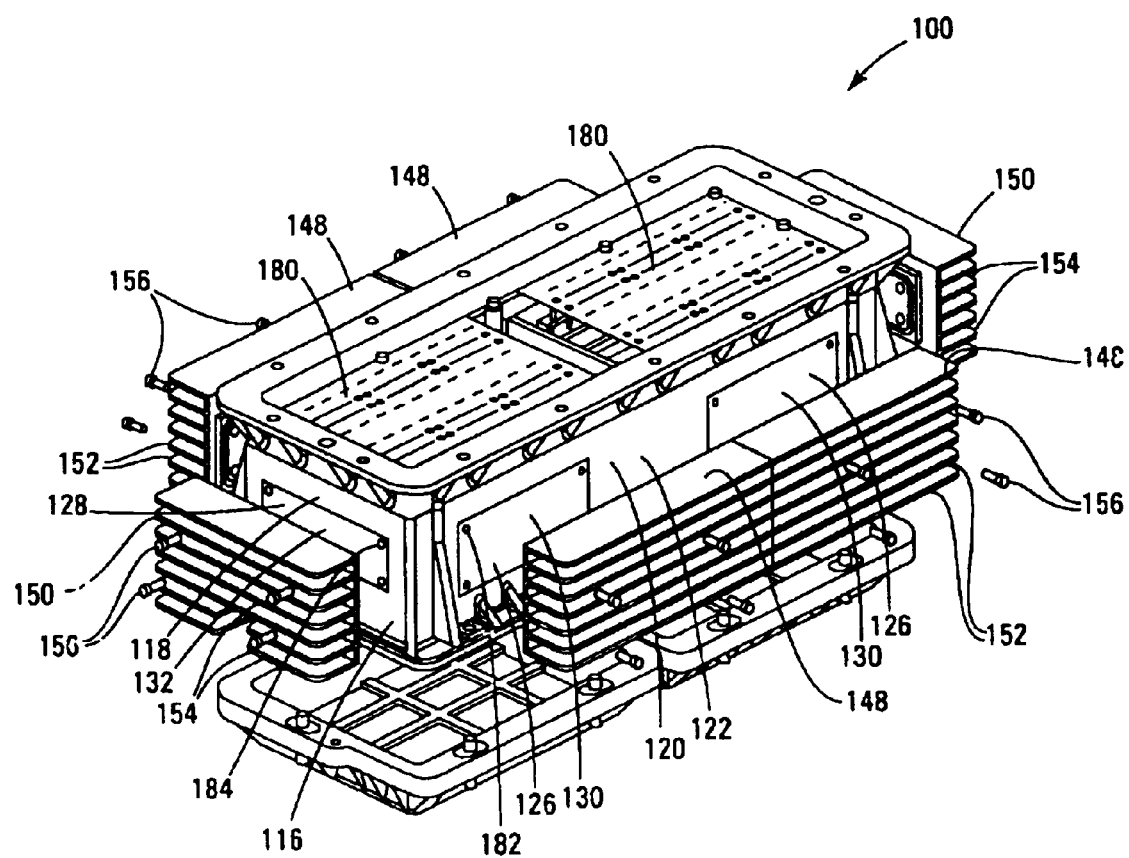
FIG. 4 is a exploded bottom isometric view of the housing of FIG. 1.

FIG. 4 is an exploded bottom isometric view of housing 100. A side heat sink 148 is attached to surface 130 of each of side protrusions 126 so as to make direct contact therewith. This thermally couples the side heat sink 148 with the respective one of liners 124. An end heat sink 150 is attached to surface 132 of each of end protrusions 128. The end heat sink 150 makes direct contact with surface 132, thus thermally coupling the end heat sink 150 to the respective liner 124. In one embodiment, side heat sinks 148 and end heat sinks 150 respectively include fins 152 and 154. Fasteners 156, such as cap screws or the like, attach side heat sinks 148 and end heat sinks 150 respectively to surfaces 130 and 132, as shown in FIG. 4. In one embodiment, side heat sinks 148 and end heat sinks 150 are of a thermally conductive material, such as aluminum, copper, brass, or the like.

Heat is conducted from each of circuit cards 114 to the respective cases 110 containing them via the direct contact between circuit cards 114 and the respective cases 110. Heat is conducted from cases 110 to liners 124 via the direct contact between cases 110 and liners 124. Heat is conducted from liners 126 through side protrusions 126 and end protrusions 128 respectively to side heat sinks 148 and end heat sinks 150 via direct contact between side protrusions 126 and side heat sinks 148 and direct between end protrusions 128 and end heat sinks 150. Heat is transferred from side heat sinks 148 and end heat sinks 150 to an environment surrounding housing 100.

FIG. 4 also shows a pair of backplanes 180 disposed within housing 100. Circuit cards 114 of each of cases 110 are respectively electrically connected to backplanes 180. In one embodiment, a single backplane is used in place of the pair of backplanes 180, as described in U.S. patent application Ser. No. 10/059,646, entitled BACKPLANE, filed on Jan. 29, 2002.

Figure 5:
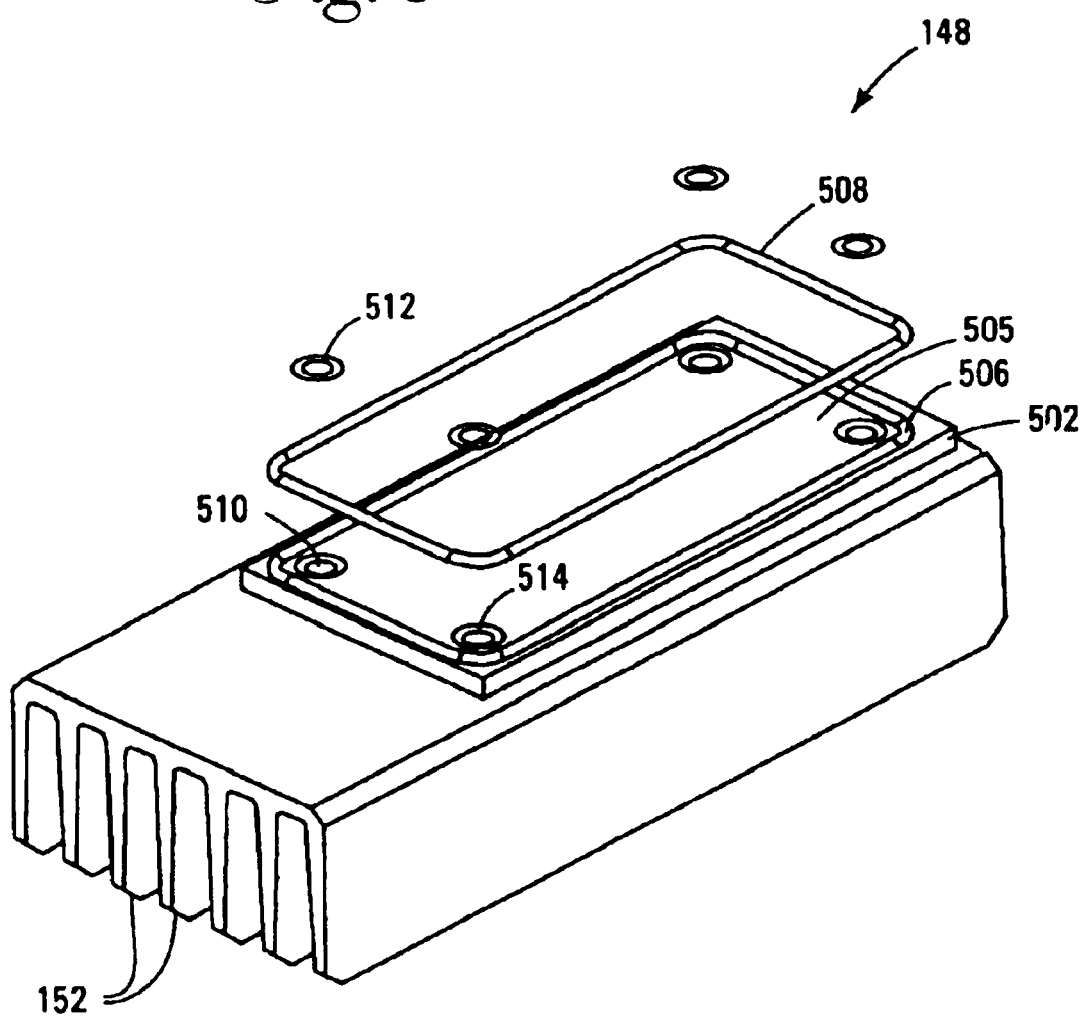
FIG. 5 illustrates a portion of a heat sink of the housing of FIG. 1 according to another embodiment of the present invention.

FIG. 5 illustrates side heat sink 148 according to another embodiment of the present invention. In one embodiment, side heat sink 148 includes a pad 502 secured to side heat sink 148 by fasteners, e.g., cap screws, welding, brazing, or the like. In another embodiment, pad 502 is integral with side heat sink 148. A surface 505 of pad 502 butts against surface 130 of one of side protrusions 126 to thermally couple side heat sink 148 to the respective one of liners 124 by direct contact. In one embodiment, a groove 506 is disposed in pad 502 around surface 505 for receiving a seal 508 that is compressed against surface 122 of sidewall 120 around side protrusion 126 to seal against a pressure differential and/or the weather.

Through holes 510 pass through side heat sink 148. When surface 505 butts against surface 130 of one of side protrusions 126, through holes 510 respectively align with threaded blind holes 182 in surface 130 (shown in FIG. 4) of the respective side protrusion 126. Fasteners 156 pass through holes 510 and thread into threaded blind holes 182 to attach side heat sink to surface 130. In one embodiment O-rings 512 are received in recesses 514, disposed in surface 505 around holes 510. When surface 505 butts against surface 130, O-rings 512 form a seal between the respective side protrusion 126 and side heat sink 148 that seals against a pressure differential and/or the weather.

Figure 6:
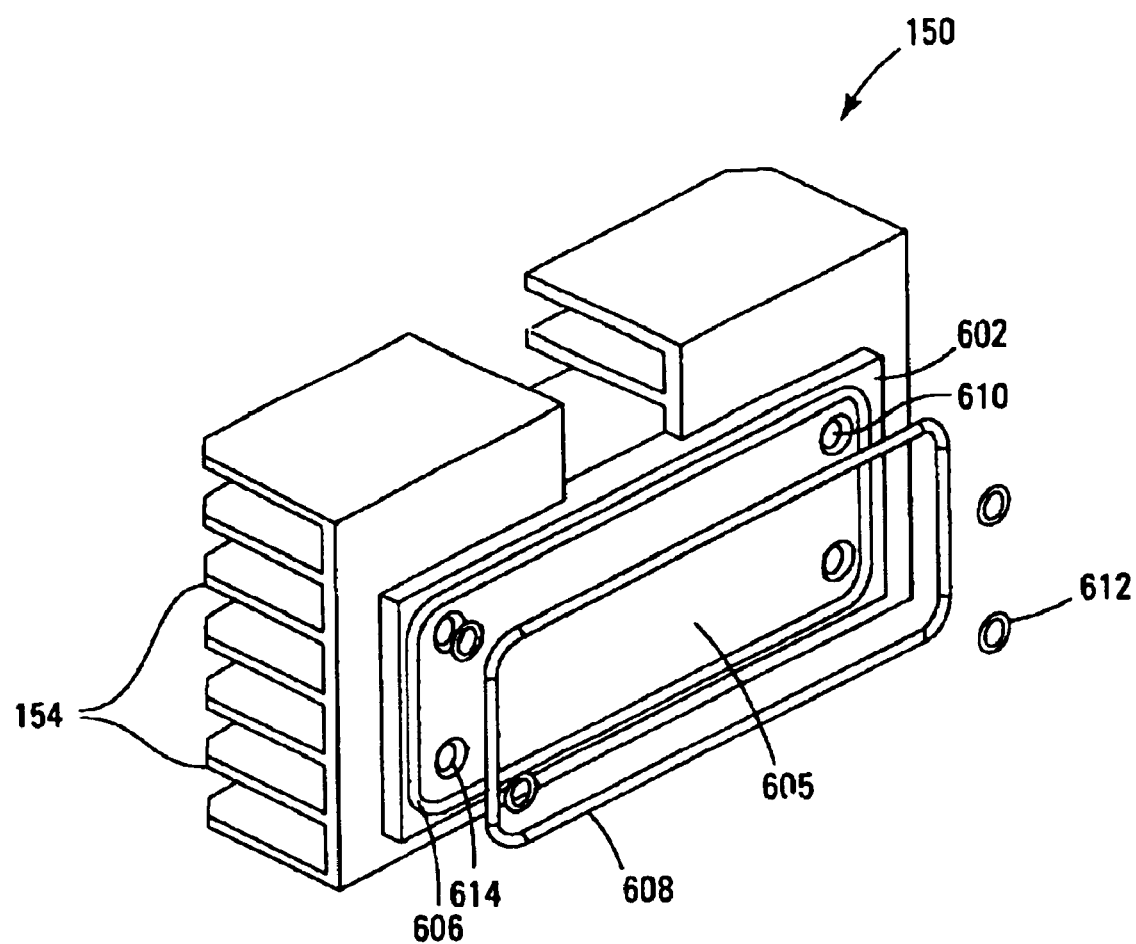
FIG. 6 illustrates another heat sink of the housing of FIG. 1 according to another embodiment of the present invention.

FIG. 6 illustrates end heat sink 150. In one embodiment, end heat sink 150 includes a pad 602 secured to end heat sink 150 by fasteners, e.g., cap screws, welding, brazing, or the like. In another embodiment, pad 602 is integral with end heat sink 150. A surface 605 of pad 602 butts against surface 132 of one of end protrusions 128 to thermally couple end heat sink 150 to the respective one of liners 124 by direct contact. In one embodiment, a groove 606 is disposed in pad 602 around surface 605 for receiving a seal 608 that is compressed against surface 118 of end wall 116 around end protrusion 128 to seal against a pressure differential and/or the weather.

Through holes 610 pass through end heat sink 150. When surface 605 butts against surface 132 of one of end protrusions 128, through holes 610 respectively align with threaded blind holes 184 in surface 132 (shown in FIG. 4) of the respective end protrusion 128. Fasteners 156 pass through holes 610 and thread into threaded blind holes 184 to attach end heat sink to surface 132. In one embodiment O-rings 612 are received in recesses 614, disposed in surface 605 around holes 610. When surface 605 butts against surface 132, O-rings 612 form a seal between the respective end protrusion 128 and end heat sink 150 that seals against a pressure differential and/or the weather.

Molding shell 102 over liners 124 forms the pressure seal between each of liners 124 and shell 102 at the perimeter 190 of each of side protrusions 126 and the end protrusion 128. This overcomes many of the sealing problems associated with heat sinks that extend through apertures within housings to thermally contact cases located within the housings for containing circuit cards. In one embodiment, the pressure seal between shell 102 and the respective liners 124 seals shell 102 against a pressure differential of about 15 psi.

Figure 7:
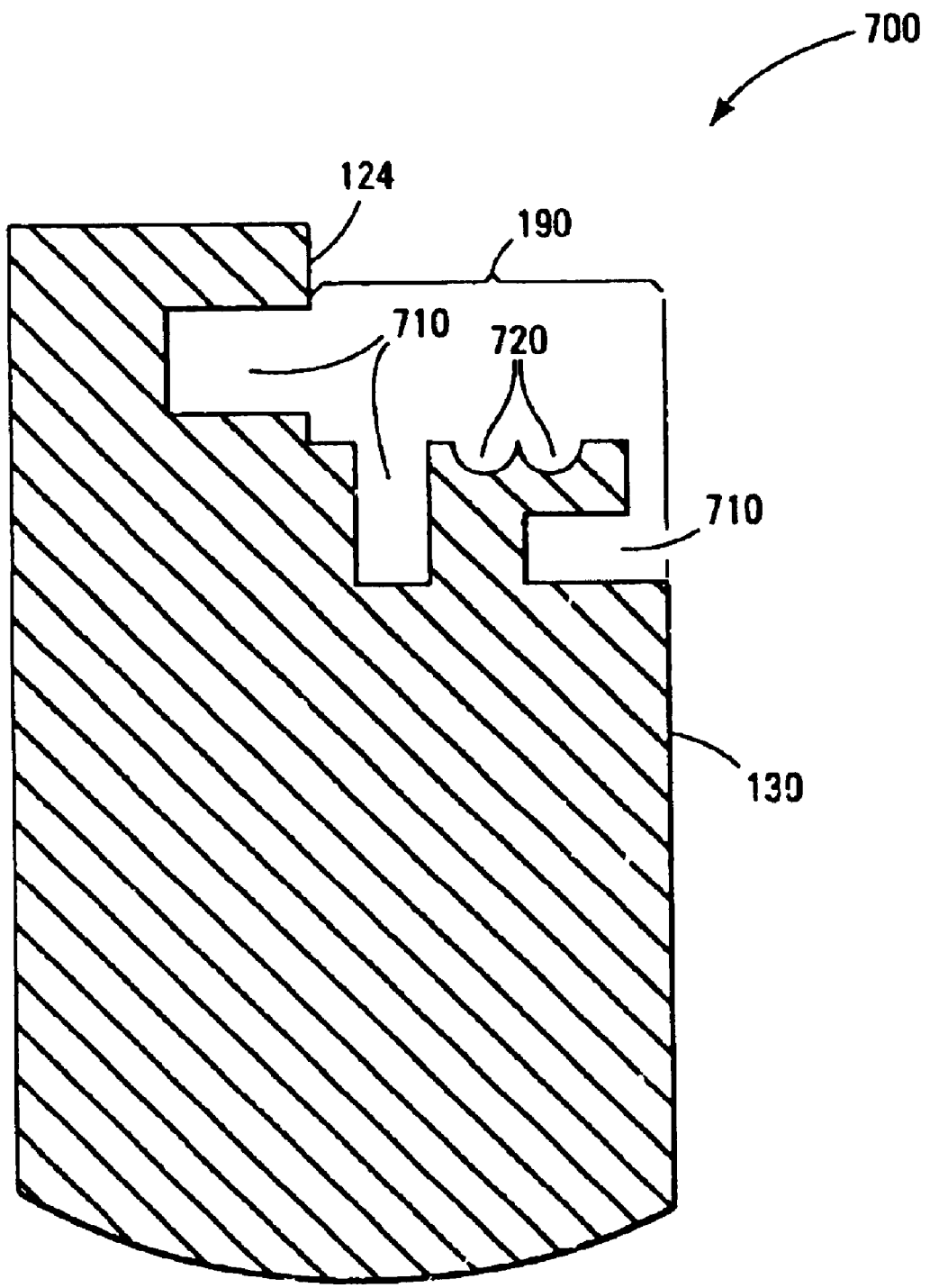
FIG. 7 is an enlarged view of region 700 of FIG. 2.

FIG. 7 is an enlarged cross-sectional view of region 700 of FIG. 2 illustrating perimeter 190 of one embodiment of a side protrusion 126. In one embodiment, perimeter 190 includes rectangular slots 710 and semi-circular slots 720. During molding, molten shell material flows into slots 710 and 720 substantially filling them. When the shell material solidifies, ribs of shell material extend into slots 710 and 720 of perimeter 190 to bond perimeter 190 to shell 102. This forms the pressure seal between perimeter 190 and shell 102. In one embodiment, the pressure seal between perimeter 190 and shell 102 also seals against the weather.

Conclusion

Embodiments of the present invention have been described. The embodiments provide a housing for circuit cards. The housing is interiorly lined with a thermally conductive liner that is integral with the housing. A protrusion of the liner extends through the housing and contacts the housing to form a pressure seal between the liner and the housing. A heat sink is disposed on an exterior of the housing and is thermally coupled to the protrusion of the liner. A case is disposed within the liner and is thermally coupled thereto. The case is adapted to receive a plurality of circuit cards so that the plurality of circuit cards is thermally coupled to the case. Therefore, the plurality of circuit cards is thermally coupled to the heat sink via the case and liner. The thermally conductive liner overcomes many of the sealing problems associated with heat sinks that extend through apertures within housings to thermally contact cases located within the housings for containing circuit cards.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, housing 100 is not limited to two compartments 108. Instead, housing 100 can have a single compartment 108 having a liner 124, a case 110, a cover 104, and an opposing cover 106. In another embodiment, housing 100 can have three or more compartments 108 each having a liner 124 and a case 110, a cover 104 for covering each compartment, and a cover 106. It is manifestly intended that this invention be limited only by the following claims and equivalents thereof.

What is claimed is:

1. A housing for circuit cards, comprising:
a shell;
a thermally conductive liner integral with the shell and lining an interior of the shell, a protrusion of the liner extending through the shell and contacting the shell to form a pressure seal between the liner and the shell;
a heat sink disposed on an exterior surface of the shell and thermally coupled to the protrusion of the liner; and
a case disposed within the liner and thermally coupled to the liner, the case adapted to receive a plurality of circuit cards so that the plurality of circuit cards is thermally coupled to the case.

2. The housing of claim 1, further comprising first and second opposing covers adapted to selectively close the shell.

3. The housing of claim 1, further comprising first and second opposing covers adapted to selectively seal the shell against at least one of the weather and a pressure differential.

4. The housing of claim 1, wherein the shell extends into slots in a perimeter of the protrusion to form the pressure seal between the liner and the shell.

5. The housing of claim 1, wherein the heat sink includes a plurality of fins.

6. The housing of claim 1, wherein the case comprises a plurality of slots adapted to respectively receive the plurality of circuit cards therein.

7. The housing of claim 1, wherein the case is in direct contact with the liner.

8. The housing of claim 1, wherein the heat sink is in direct contact with the protrusion of the liner.

9. The housing of claim 1, further comprising a seal disposed between the heat sink and the exterior surface of the shell around the perimeter of the protrusion of the liner for sealing against at least one of a pressure differential and the weather.

10. The housing of claim 1, wherein the pressure seal between the liner and the shell also seals against weather.

11. The housing of claim 1, wherein the heat sink includes one or more seals disposed between the heat sink and the protrusion for sealing against at least one of a pressure differential and the weather.

12. A housing for circuit cards comprising:
a shell having at least two compartments;
at least two thermally conductive liners integral with the shell and respectively lining the at least two compartments, each of the at least two liners having a protrusion extending through the shell, the protrusion contacting the shell to form a pressure seal between the respective liner and the shell;
at least two cases respectively disposed in each of the at least two liners and thermally coupled thereto, each of the at least two cases having a plurality of slots, each slot adapted to receive each of a plurality of circuit cards so that each of the plurality of circuit cards is thermally coupled to the respective case; and
a heat sink disposed on an exterior surface of the shell and thermally coupled to the protrusion of each of the at least two liners.

13. The housing of claim 12, wherein the shell extends into slots in a perimeter of the protrusion of each of the at least two liners to form the pressure seal between the respective liner and the shell.

14. The housing of claim 12, wherein the heat sink includes a plurality of fins.

15. The housing of claim 12, wherein each of the at least two cases is respectively in direct contact with each of the at least two liners.

16. The housing of claim 12, wherein the heat sink is in direct contact with the protrusion of each of the at least two liners.

17. The housing of claim 12, further comprising at least two first covers each adapted to respectively selectively close each of at least two apertures respectively of the at least two compartments.

18. The housing of claim 17, further comprising a second cover adapted to selectively close an aperture of the shell located opposite each of the at least two apertures respectively of the at least two compartments.

19. The housing of claim 18, wherein the at least two first covers and the second cover selectively seal the shell against at least one of the weather and a pressure differential.

20. The housing of claim 12, wherein the pressure seal between the respective liner and the shell also seals against weather.

21. A housing for circuit cards comprising:
a shell having two sidewalls in opposition, two end walls in opposition, and two compartments;
two thermally conductive liners integral with the shell and respectively lining the two compartments, each of the two liners having two first protrusions respectively extending through the two side walls and a second protrusion extending through one of the two end walls, each of the two first protrusions and the second protrusion of each of the two liners contacting the shell to form a pressure seal between the respective liner and the shell;

two cases respectively disposed in each of the two liners and thermally coupled thereto, each of the two cases having a plurality of slots, each slot adapted to receive each of a plurality of circuit cards so that each of the plurality of circuit cards are thermally coupled to the respective case;

a first heat sink disposed on each of the two sidewalls and thermally coupled to one of the two first protrusions of each of the two liners; and a second heat sink disposed on each of the two end walls and thermally coupled to the second protrusion of each of the two liners.

22. The housing of claim 21, wherein the shell extends into slots in a perimeter of each of the two first protrusions and the second protrusion of each of the two liners to form the pressure seal between the respective liner and the shell.

23. The housing of claim 21, wherein the first and second heat sinks include a plurality of fins.

24. The housing of claim 21, further comprising two first covers each adapted to respectively selectively close each of two apertures respectively of the two compartments.

25. The housing of claim 24, further comprising a second cover adapted to selectively close an aperture of the shell located opposite each of the two apertures respectively of the at least two compartments.

26. The housing of claim 25, wherein the two first covers and the second cover selectively seal the shell against at least one of the weather and a pressure differential.

27. The housing of claim 21, wherein the first heat sink comprises one first heat sink thermally coupled one of the two first protrusions of one of the two liners and another first heat sink thermally coupled one of the two first protrusions of another of the two liners.

28. A method for transferring heat from a circuit card, the method comprising:

conducting heat from the circuit card to a case adapted to contain the circuit card;

conducting the heat from the case to a liner that contains the case, wherein the liner lines an interior of a housing and is integral with the housing, wherein a protrusion of the liner extends through the housing to an exterior of the housing and contacts the housing to form a pressure seal between the liner and the housing; and conducting the heat through the protrusion to a heat sink disposed on the exterior of the housing.

29. The method of claim 28, further comprising transferring the heat from the heat sink to an environment surrounding the housing.

30. The method of claim 28, wherein conducting heat from the circuit card to a case adapted to contain the circuit card comprises conducting heat from each of a plurality of circuit cards respectively contained in slots of a case.

31. The method of claim 28, wherein conducting the heat through the protrusion to a heat sink comprises conducting the heat through the protrusion to a heat sink having a plurality of fins.

* * * * *